United States Patent [19]
Raiser et al.

[11] Patent Number: 6,049,124
[45] Date of Patent: *Apr. 11, 2000

[54] SEMICONDUCTOR PACKAGE

[75] Inventors: George F. Raiser; Gregory Turturro, both of Chandler, Ariz.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/988,231

[22] Filed: Dec. 10, 1997

[51] Int. Cl.⁷ .......................... H01L 23/48; H01L 23/52; H01L 29/40

[52] U.S. Cl. .......................... 257/712; 257/737; 257/738; 257/782; 257/778; 257/787

[58] Field of Search ..................... 257/680, 737, 257/738, 787, 796, 780, 781, 782, 618, 623; 438/108; 228/180.22

[56] References Cited

U.S. PATENT DOCUMENTS

| | | | |
|---|---|---|---|
| 5,093,708 | 3/1992 | Solomon | 257/778 |
| 5,311,059 | 5/1994 | Banerji et al. | 257/778 |
| 5,319,242 | 6/1994 | Carney et al. | 257/680 |
| 5,450,283 | 9/1995 | Lin et al. | 257/787 |
| 5,554,887 | 9/1996 | Sawai et al. | 257/737 |
| 5,641,996 | 6/1997 | Omoya et al. | 257/787 |
| 5,706,176 | 1/1998 | Quinn et al. | 257/700 |
| 5,751,055 | 5/1998 | Maruyama et al. | 257/618 |
| 5,844,320 | 12/1998 | Ono et al. | 257/778 |
| 5,898,224 | 4/1999 | Akram | 257/778 |

*Primary Examiner*—Mahshid Saadat
*Assistant Examiner*—Jhihan B Clark
*Attorney, Agent, or Firm*—Blakey, Sokoloff, Taylor & Zafman LLP

[57] ABSTRACT

A semiconductor package which includes a package substrate and a semiconductor chip located on the package substrate have coefficients of thermal expansion which differs by a large margin. The semiconductor chip has beveled edges and an epoxy is provided which reduce stresses on the semiconductor chip when the package is being heated.

10 Claims, 5 Drawing Sheets

SEMICONDUCTOR PACKAGE

BACKGROUND OF THE INVENTION

1. Field of the Invention

This invention relates to a semiconductor chip, a semiconductor package and to a method of assembling a semiconductor package, and to a method of producing a semiconductor chip.

2. Discussion of Related Art

The term "frontside" of a semiconductor wafer or semiconductor chip, as used herein, denotes the side of the semiconductor wafer or semiconductor chip which carries integrated circuitry, and the term "backside", as used herein, denotes a side of the semiconductor wafer or the semiconductor chip opposing the frontside.

A semiconductor package usually includes a package substrate and a semiconductor chip located on or in the package substrate. Semiconductor chips are commonly produced with C4 (controlled collapse chip connect) solder connections, on a frontside thereof, for purposes of electrically contacting the integrated circuit on the frontside of the chip to contact pads on the package substrate, electronically connecting the chip to the package substrate. An epoxy is typically introduced under capillary action into a space between the semiconductor chip and the package substrate and is subsequently cured. The epoxy acts to bond the semiconductor chip to the package substrate and to protect the C4 solder connections during the temperature cycling it will experience during the product's lifetime.

The semiconductor chip is made primarily of silicon which has a coefficient of thermal expansion (CTE) of about 3.3 ppm/° C. (parts per million per ° C.). In the past, the package substrate was generally made of a ceramic material, which has a coefficient of thermal expansion that is typically below 6 ppm/° C. During heating or cooling of the semiconductor package, the coefficients of thermal expansion of the semiconductor chip and the ceramic package substrate, respectively, were not of a magnitude which caused substantial deformation caused by stress buildup in the package.

Ceramic has a relatively high dielectric constant which causes stray capacitance to build up within the package substrate, resulting in resistance-capacitance (RC) delay. The move in recent years has therefore been away from ceramic as a package substrate material to alternative materials, such as plastics or other organic materials, which have lower dielectric constants. A problem with these alternative materials, on the other hand, is that they usually have relatively high coefficients of thermal expansion, compared to the coefficient of thermal expansion of the semiconductor chip. Plastic substrates often have coefficients of thermal expansion on the order of 17 ppm/° C. Heating or cooling of the semiconductor package thus results in substantial stress and deformation in the semiconductor chip.

As discussed above and in reference to FIG. 1, an epoxy material 102, generally a glass-filled epoxy, is provided within the space between the semiconductor chip 104 and the package substrate 106 and cured. The step of curing the epoxy involves elevating the temperature of the semiconductor package 108 to a given temperature for a specific period of time. Once the curing procedure is complete, the semiconductor package is then cooled to ambient temperature. FIG. 1 illustrates an organic semiconductor package 108 after being cured and cooled to ambient temperature. Since the CTE of the organic package substrate 106 is much greater than the CTE of the semiconductor chip 104, the package substrate 106 tends to reduce in size during cooling at a much faster rate than the semiconductor chip 104. This causes the semiconductor package 108 to warp in a manner that results in an outward bowing or bending of the semiconductor chip 104.

Bending or bowing of the semiconductor chip is problematic, in that it induces greater stresses along the backside 109 of the semiconductor chip. Surface defects 114, such as nicks and scratches, are generally present along the backside edges of the semiconductor chip as a result of the sawing procedure used to separate the chip from a wafer. Since stress concentrations along the backside edge of the chip are particularly high, bending of the chip causes the cracks to develop rapidly into longer cracks which propagate through the semiconductor chip. Propagation of the defects can cause severe damage to the chip, and can eventually cut through active circuitry on a frontside 111 of the semiconductor chip, resulting in electrical failure of the semiconductor chip.

The difference in the CTE of the semiconductor chip 104 and organic package substrate 106 also produces tensile stresses 110 and sheer stresses 112 that act upon the epoxy interface 102 that joins the two components. These stresses tend to delaminate the epoxy interface material from the semiconductor chip, particularly at the frontside edges of the chip where higher stress concentrations reside.

SUMMARY OF THE INVENTION

According to one aspect of the invention there is provided a semiconductor chip which has a backside with a beveled edge.

BRIEF DESCRIPTION OF THE DRAWINGS

The present invention is illustrated by way of example and not limitation in the figures of the accompanying drawings, in which like references indicate similar elements and in which.

DETAILED DESCRIPTION OF THE INVENTION

A semiconductor chip, a semiconductor package, a method of assembling a semiconductor package, and a method of producing a semiconductor chip are described. In the following description, for purposes of explanation, numerous specific details are set forth in order to provide a thorough understanding of the present invention. It will be evident, however, to one skilled in the art that the present invention may be practiced without these specific details. In other instances well known semiconductor processes and methods have not been described in order to not obscure the present invention.

Figure 1:
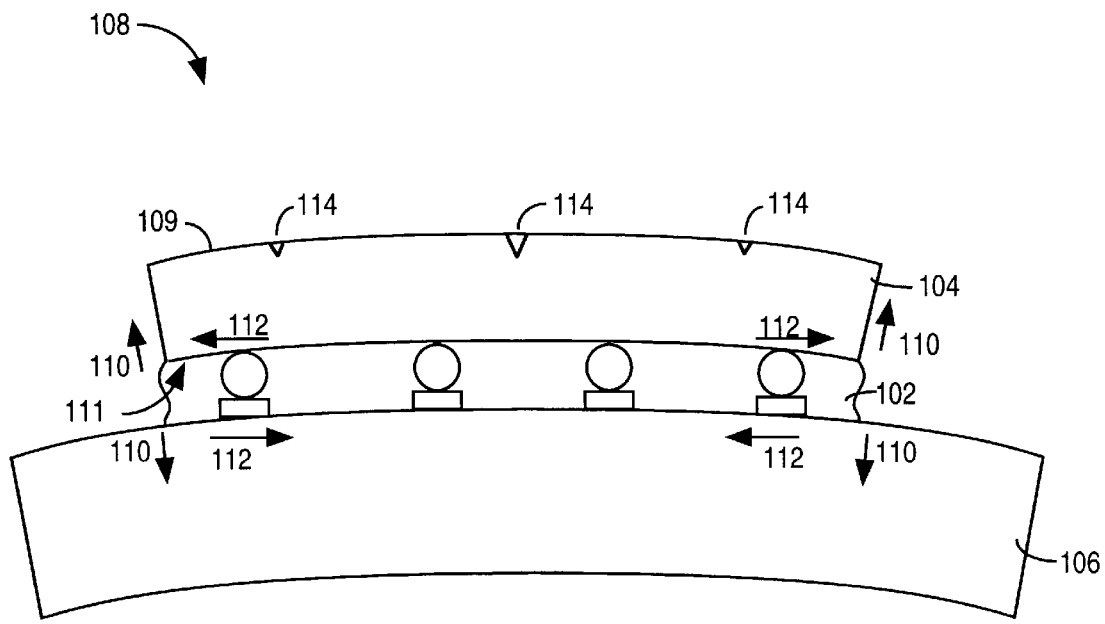
FIG. 1 is a side view of a prior art semiconductor package.
Figure 2:
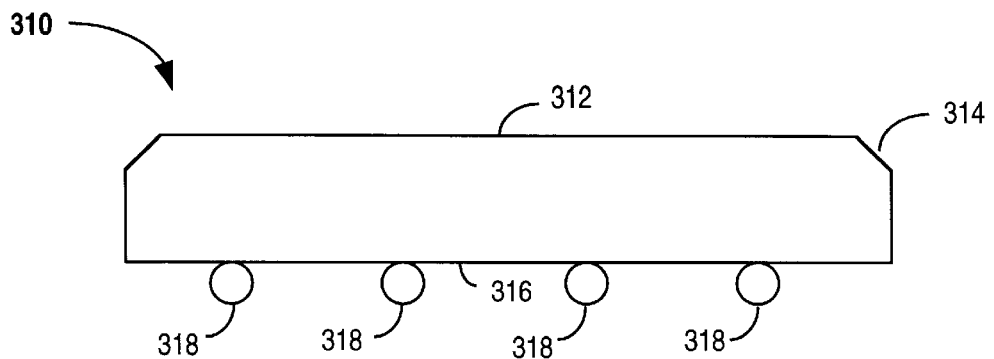
FIG. 2 is a side view of a semiconductor chip according to one embodiment of the invention.

FIG. 2 of the accompanying drawings illustrates a semiconductor chip 310, according to one embodiment of the invention, that has a backside 312 having a beveled edge 314. In one embodiment, the semiconductor chip 310 is about 29 mils thick and the bevel is about 25% of the thickness of the semiconductor chip 310. It is to be understood, however, that the present invention is not limited by the depth or size of beveled edge. The semiconductor chip 310 also has a frontside 316 with a plurality of C4 solder connections 318 thereon. The solder connections 318 may be substituted by solder columns, gold solder connections, or any other connecting means that is capable of providing electrical interconnect between the chip 310 and a host device, such as a package substrate, motherboard, or the like.

Cornered backside edges are problematic in that stress concentrations are at their highest along the pointed edges. In addition, nicks, scratches, or other surface defects often exist on such edges because of the sawing operation used in cutting the chips. The beveled edge 314 of the backside 312 of the semiconductor chip 310 thus firstly serves to reduce stress concentrations which develop along edges of the backside 312 of the semiconductor chip 310 and, secondly, provides the backside 312 of the semiconductor chip 310 with an edge which is finished off so as to reduce the number of small nicks, scratches or other surface defects which can propagate through the semiconductor chip 310 causing severe damage thereto. As previously discussed, the cornered edges of the chip are particularly susceptible to the formation of surface defects from sawing procedures and other manufacturing processes.

It should be noted that the shape of the beveled edge 314 is not limited to any specific geometric configuration. The beveled edge 314 can take on any form, such as rounded or angular configurations.

Figure 3A:
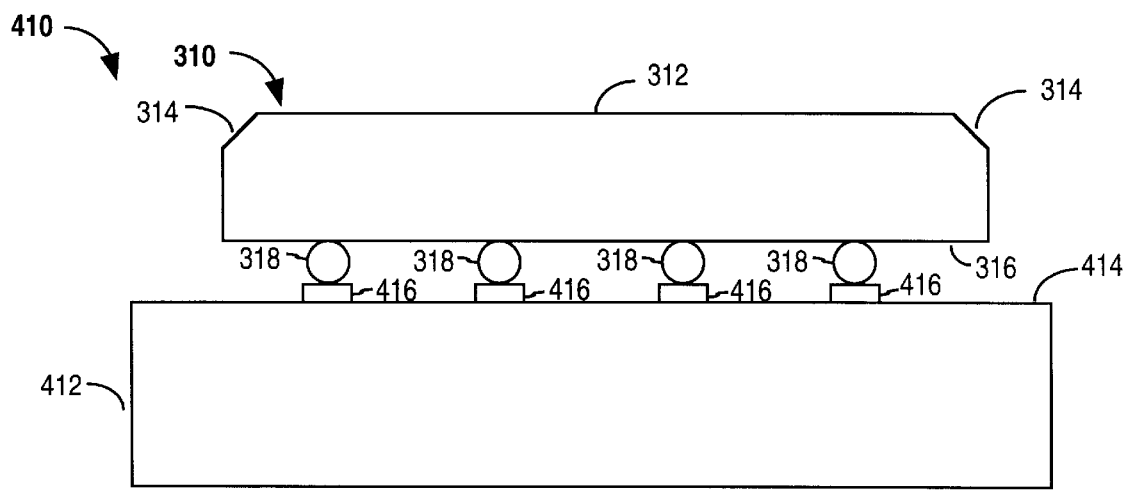
FIG. 3A is a side view of a package substrate with the semiconductor chip of FIG. 2 located thereon.

FIG. 3A illustrates a semiconductor package 410 having a package substrate 412 supporting a semiconductor chip 310 that has a backside 312 with a beveled edge 314. The package substrate 412 has a surface 414 having a plurality of electrical contact pads 416 thereon. The semiconductor chip 310 is located on the package substrate 412 so that the C4 solder connections 318 on the frontside 316 of the semiconductor chip 310 electrically contact the contact pads 416. Mechanical and electrical connection between chip 310 and package substrate 412 is achieved by passing package 410 through a reflow furnace to cause the C4 solder connection 318 to be wetted onto contact pads 416.

Figure 3B:
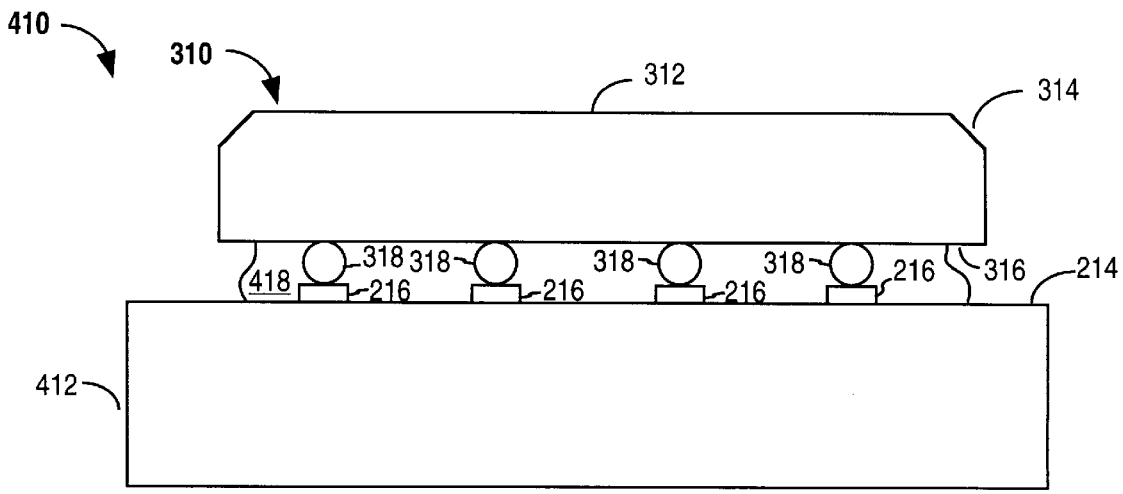
FIG. 3B illustrates the semiconductor package of FIG. 3A with an epoxy provided between the semiconductor chip and the package substrate.

FIG. 3B illustrates the semiconductor package 410 of FIG. 3A wherein an epoxy underfill 418 is applied in a space provided between the semiconductor chip 310 and the package substrate 412. The epoxy underfill 418 is introduced on a side of the semiconductor chip 310 and flows under capillary action into the space provided between the semiconductor chip 310 and the package substrate 412. The epoxy 418 provides protection for the C4 solder connections 318 during temperature cycles and is preferably of a substance which has a coefficient of thermal expansion which is similar to the coefficient of thermal expansion of the C4 solder connections. The epoxy also acts to bond chip 310 to package substrate 412. In one embodiment the epoxy contains spherical silicon dioxide particles in order to provide the epoxy with a coefficient of thermal expansion which closely matches the coefficient of thermal expansion of the C4 solder balls. The solder balls typically have a coefficient of thermal expansion of about 23 ppm/° C. and the epoxy of about 20–30 ppm/° C.

Figure 3C:
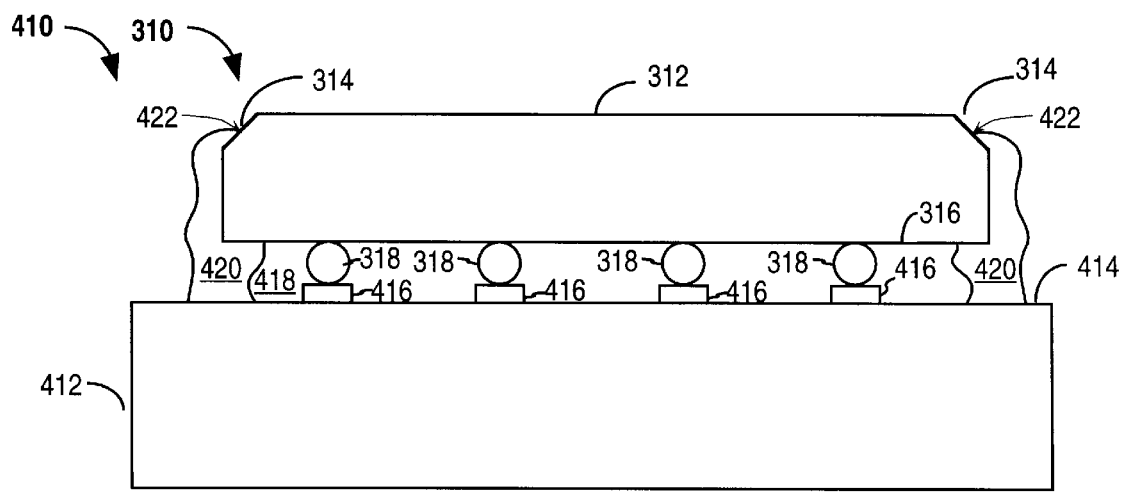
FIG. 3C illustrates the semiconductor package of FIG. 3B with an epoxy fillet located about the periphery of the semiconductor chip.

FIG. 3C illustrates the semiconductor package 410 of FIG. 3B after application of additional epoxy fillet 420. The epoxy fillet 420 is applied on the package substrate 412 about a periphery of the semiconductor chip 310 so as to cover a side of the semiconductor chip 310 up to a position 422 on the beveled edge 314. The epoxy fillet 420 may be the same as or be different from the epoxy underfill 418.

The semiconductor package 410 is then heated to about 120° C. for about 30 minutes and then to about 150° C. for about 3 hours, causing the epoxy underfill 418 and fillet 420 to cure. The semiconductor package 410 is then allowed to cool down to room temperature.

The semiconductor chip 310 is made of silicon which has a coefficient of thermal expansion of about 3.3 ppm/° C. The package substrate 412 could have a coefficient of thermal expansion which differs from the coefficient of thermal expansion of the semiconductor chip 310 by a relatively large amount. For example, the package substrate 412 may have a coefficient of thermal expansion of more than 6 ppm/° C., thus differing from the coefficient of thermal expansion of the semiconductor chip 310 by at least 2.7 ppm/° C. The package substrate 412 may, for example, be made of a plastic or other organic material with a coefficient of thermal expansion of about 17 ppm/° C. These differences in coefficients of thermal expansion result in buckling or bowing of the semiconductor chip 310 when the semiconductor package 410 is being heated or cooled. The buckling or bowing induces greater stresses along the edges of the backside 312 of the semiconductor chip 310 where stress concentrations and surface defects are the most prominent. The stresses induced by the coefficient of thermal expansion mismatch between the package substrate 412 and the semiconductor chip 310 can cause the surface defects to propagate through the semiconductor chip 310, resulting in severe damage thereto and, eventually, in electrical failure of the semiconductor chip 310. As hereinbefore described, the problem of stress concentrations and of surface defects are dealt with by providing the beveled edge 314 on the backside 312 of the semiconductor chip 310.

The stress concentrations may be further reduced by applying the epoxy fillet 420 so as to at least partially cover the beveled edge 314 on the backside 312 of the semiconductor chip 310. Tensile and sheer stresses which tend to delaminate the semiconductor chip 310 from the package substrate 412 are reduced by the epoxy fillet 420 acting to distribute these stresses over a larger surface area. A further advantage of the epoxy fillet 420 is that it covers and seals minor defects that remain on the surface of the beveled edge 314, thus reducing the chances that these defects will propagate through the semiconductor chip 310.

It is therefore possible to use a semiconductor chip 310 on a package substrate 412 wherein the semiconductor chip 310 and the package substrate 412 have coefficients of thermal expansion which differ by a relatively large amount, without surface defects and cracks propagating from the area of the edge of the backside 312 of the semiconductor chip 310 during heating or cooling of the semiconductor package 410, and without the semiconductor chip 310 delaminating from the substrate package 412.

Figure 4:
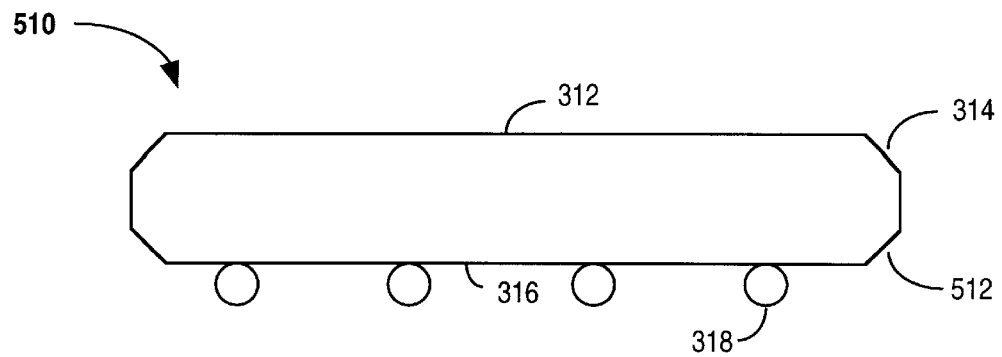
FIG. 4 is a side view of a semiconductor chip according to another embodiment of the invention.

FIG. 4 illustrates a semiconductor chip 510, according to an alternative embodiment of the invention, which is similar to the semiconductor chip 310 of FIG. 2, except that the frontside 316 also has a beveled edge 512. The beveled edge 512 serves as a funnel to assist in the introduction of an underfill epoxy around the C4 solder connections after the chip has been attached to a package substrate, motherboard, or the like, about the semiconductor chip 510. The semiconductor chip 510 of FIG. 4 is the same as the semiconductor chip 310 of FIG. 2 in all other respects.

Figure 5:
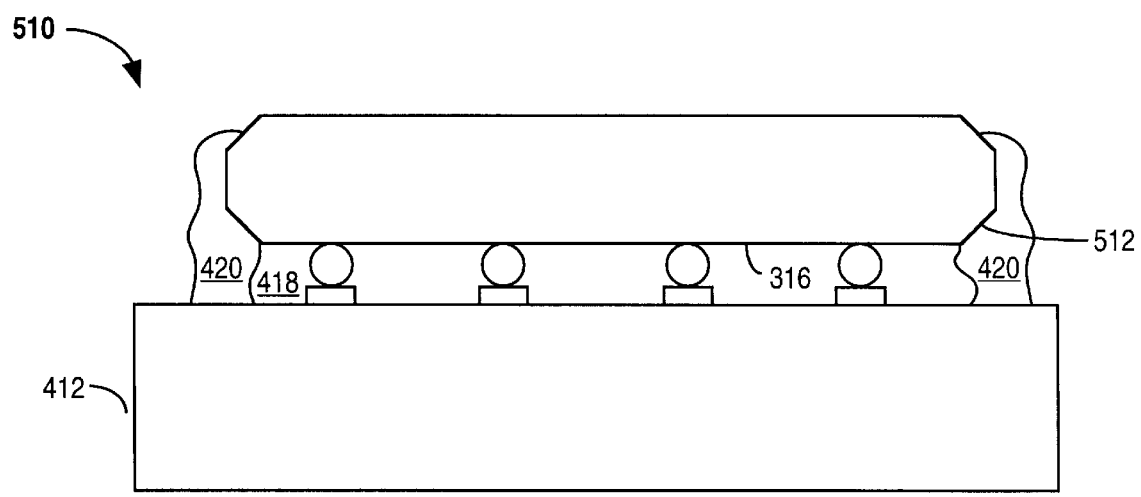
FIG. 5 is a side view of a package substrate with the semiconductor chip of FIG. 4 located thereon.

FIG. 5 shows semiconductor chip 510 attached to package substrate 412.

Figure 6A:
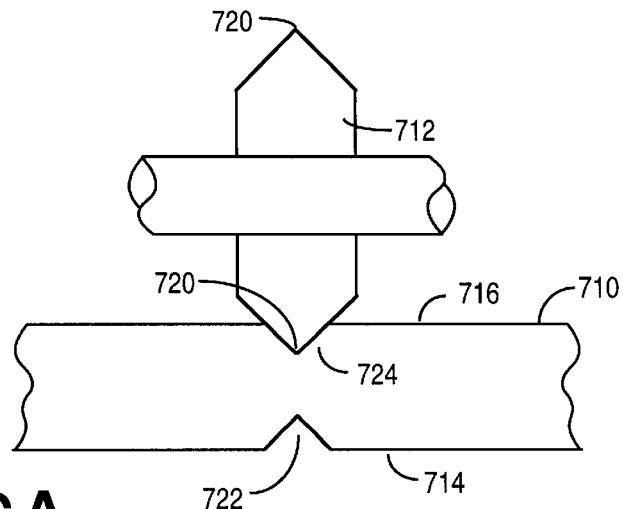
FIG. 6A is a view illustrating the formation of grooves in a semiconductor wafer.
Figure 6B:
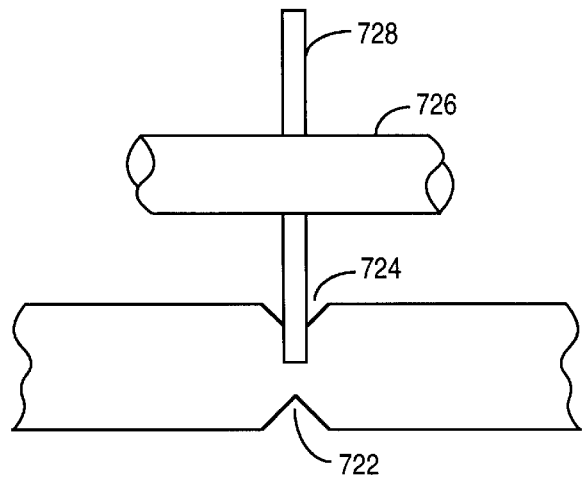
FIG. 6B is a view of the semiconductor wafer of FIG. 6A being cut.
Figure 6C:
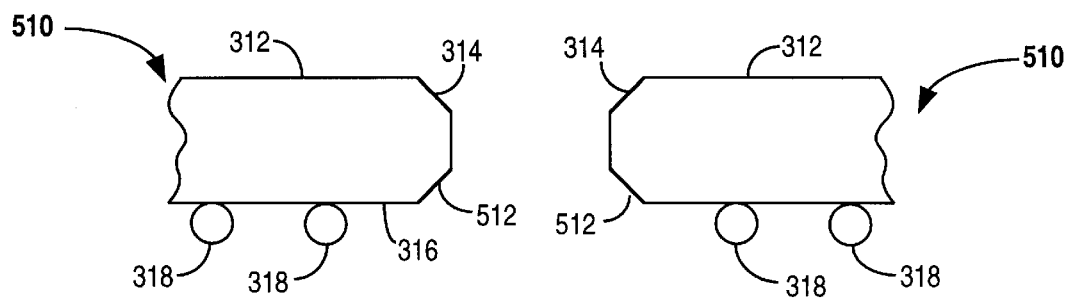
FIG. 6C is a view of the semiconductor wafer of FIG. 6B after the semiconductor wafer has been cut.

FIGS. 6A to 6C illustrate a method of producing the semiconductor chip 510 of FIG. 5.

FIG. 6A illustrates a semiconductor wafer 710 and a first wheel 712 which is used for cutting a groove into the wafer 710.

The wafer 710 has a frontside 714 and a backside 716. A plurality of C4 solder connections 318 are provided on the frontside 714 of the wafer 710.

The first wheel 712 has an angular tip 720 which cuts generally "V" shaped grooves. A first "V" shaped groove 722 is first cut in the frontside 714 of the wafer 710 and a second "V" shaped groove 724 is then cut parallel to the first groove 722 on the backside 716 of the wafer 710.

FIG. 6B illustrates the use of a second wheel 726 with a disk shaped cutting edge 728 for cutting from the second "V" shaped groove 724 to the first "V" shaped groove 722 through the wafer 710. The wafer 710 may be cut in this way in a conventional crisscross manner to sever respective semiconductor chips.

FIG. 6C illustrates two semiconductor chips 510, such as in FIG. 4, which have been severed in the manner as described with reference to FIG. 6b. The grooves 722 and 724 are wider than the disk shaped cutting edge 728 so that each semiconductor chip 510 has a frontside 316 which is left with a beveled edge 512 and a backside 312 which is also left with beveled edge 314.

Thus, a semiconductor chip, a semiconductor package, a method of assembling a semiconductor package, and a method of producing a semiconductor chip have been described. Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed:

1. A semiconductor package which includes:

a package substrate of an organic material having a coefficient of thermal expansion of at least 15 ppm/°C., the package substrate having a plurality of contact pads;

a semiconductor chip having a coefficient of thermal expansion which is at least 2.7 ppm/° C. less than the coefficient of thermal expansion of the package substrate, a backside with a beveled edge on at least two sides thereof, and a frontside with a beveled edge, the frontside having a plurality of solder connections thereon, the semiconductor chip being located on the package substrate with the solder connections contacting the contact pads and electrically coupling the semiconductor chip to the package substrate; and an epoxy located between the semiconductor chip and the package substrate around the solder connections, the epoxy bonding the semiconductor chip to the package substrate, the epoxy further being located about a periphery of the semiconductor chip and at least partially covering the beveled edge on the frontside, and the beveled edge on the backside, the epoxy having a coefficient of thermal expansion which is similar to a coefficient of thermal expansion of the solder connections, the semiconductor package being capable of being heated to about 120° C. for about 30 minutes and then to about 150° C. for about 3 hours, and then being cooled to room temperature without defects propagating from the edge of the backside and without the semiconductor chip delaminating from the package substrate.

2. A semiconductor package which includes:

a package substrate of an organic material having a first coefficient of thermal expansion;

a semiconductor chip having a coefficient of thermal expansion which is at least 2.7 ppm/° C. less than the first coefficient of thermal expansion, the semiconductor chip having a frontside with a plurality of solder connections thereon and being located on the package substrate with the solder connections contacting the contact pads and electrically coupling the semiconductor chip to the package substrate, the semiconductor package the semiconductor package being capable of being heated to about 120° C. for about 30 minutes and then to about 150° C. for about 3 hours, and then being cooled to room temperature without defects propagating from the edge of the backside and without the semiconductor chip delaminating from the package substrate.

3. The semiconductor package of claim 2 wherein the semiconductor chip has a backside that is beveled on at least two opposing edges, and due to being beveled, is capable of being heated to about 120° C. for about 30 minutes and then to about 150° C. for about 3 hours, and then being cooled to room temperature without defects propagating from the edge of the backside and without the semiconductor chip delaminating from the package substrate.

4. The semiconductor chip of claim 2 wherein a frontside of the semiconductor chip is beveled on at least two opposing edges.

5. The semiconductor package of claim 3 which includes an epoxy located between the semiconductor chip and the package substrate around the solder connections, the epoxy bonding the semiconductor chip to the package substrate, the epoxy being further being located about a periphery of the semiconductor chip and at least partially covering the beveled edge on the backside.

6. The semiconductor package of claim 5 wherein the epoxy has a coefficient of thermal expansion which is similar to a coefficient of thermal expansion of the solder connections.

7. The semiconductor package of claim 6 wherein frontside of the semiconductor chip is beveled on at least two opposing edges.

8. A semiconductor package which includes:

a package substrate of an organic material having a first coefficient of thermal expansion, the package substrate having a plurality of contact pads;

a semiconductor chip having a second coefficient of thermal expansion which is at least 2.7 ppm/° C. less than the first coefficient of thermal expansion, a backside which is beveled on at least two opposing edges, the semiconductor chip being located on the package substrate with the solder connections contacting the contact pads and electrically coupling the semiconductor chip to the package substrate, the semiconductor chip, due to being beveled, being capable of being heated to about 120° C. for about 30 minutes and then to about 150° C. for about 3 hours, and then being cooled to room temperature without defects propagating from the edge of the backside and without the semiconductor chip delamination from the package substrate.

9. The semiconductor chip of claim 8 which includes an epoxy located between the semiconductor chip and the package substrate around the solder connections, the epoxy bonding the semiconductor chip to the package substrate, the epoxy being further being located about a periphery of the semiconductor chip and at least partially covering the beveled edge on the backside.

10. The semiconductor chip of claim 9 wherein the epoxy has a coefficient of thermal expansion which is similar to a coefficient of thermal expansion of the solder connections.

* * * * *